(12) United States Patent
Montana et al.

(10) Patent No.: US 9,117,300 B2
(45) Date of Patent: Aug. 25, 2015

(54) DESIGNING A MODELED VOLUME REPRESENTED BY DEXELS

(71) Applicant: Dassault Systemes, Velizy Villacoublay (FR)

(72) Inventors: Nicolas Montana, Aix-en-Provence (FR); Marc Monteil, Rognac (FR); Romain Nosenzo, Aix-en-Provence (FR); Andre Lieutier, Puyricard (FR)

(73) Assignee: Dassault Systems, Velizy Villacoublay (FR)

( * ) Notice: Subject to any disclaimer, the term of this patent is extended or adjusted under 35 U.S.C. 154(b) by 170 days.

(21) Appl. No.: 13/666,634

(22) Filed: Nov. 1, 2012

(65) Prior Publication Data

US 2013/0116983 A1 May 9, 2013

(30) Foreign Application Priority Data

Nov. 3, 2011 (EP) .................................... 11306422

(51) Int. Cl.
*G06G 7/48* (2006.01)
*G06T 19/00* (2011.01)
(Continued)

(52) U.S. Cl.
CPC ................ *G06T 19/00* (2013.01); *G06T 17/00* (2013.01); *G06F 17/50* (2013.01)

(58) Field of Classification Search
CPC .......... G06F 17/50; G06T 17/00; G06T 19/00
USPC ....................... 703/7; 700/159–160, 181–183
See application file for complete search history.

(56) References Cited

U.S. PATENT DOCUMENTS

| 4,833,617 A | 5/1989 | Wang et al. |
| 5,710,709 A | 1/1998 | Oliver et al. |

(Continued)

FOREIGN PATENT DOCUMENTS

| WO | WO 2010/082378 A1 | 7/2010 |
| WO | WO 2011/042764 A1 | 4/2011 |

OTHER PUBLICATIONS

König et al. ("Real Time Simulation and Visualization of NC Milling Processes for Inhomogeneous Materials on Low-End Graphics Hardware", http://user.engineering.uiowa.edu/~amalek/sweep/, 1999. 15 Pages.*

(Continued)

*Primary Examiner* — Eunhee Kim
(74) *Attorney, Agent, or Firm* — Hamilton, Brook, Smith & Reynolds, P.C.

(57) ABSTRACT

It is provided a computer-implemented method for designing a modeled volume. The method comprises providing a sculpting process on the modeled volume, initial lines, and an initial set of dexels that represents the modeled volume after going through the sculpting process and that is based on the initial lines; then providing new lines by refining the initial lines; and determining a new set of dexels that represents the modeled volume after going through the sculpting process and that is based on the new lines, wherein determining the new set of dexels comprises determining sets of at least one segment representing the intersection between each new line and the modeled volume before going through the sculpting process and then applying the sculpting process on the determined sets of at least one segment. The method improves designing a modeled volume represented by a set of dexels.

8 Claims, 5 Drawing Sheets

(51) Int. Cl.
    *G06T 17/00*   (2006.01)
    *G06F 17/50*   (2006.01)

(56) References Cited

U.S. PATENT DOCUMENTS

| | | | |
|---|---|---|---|
| 7,747,418 | B2 | 6/2010 | Leu et al. |
| 7,832,968 | B2 | 11/2010 | Glaesser |
| 8,538,574 | B2 | 9/2013 | Hahn |
| 2001/0048857 | A1 | 12/2001 | Koch et al. |
| 2002/0133264 | A1 | 9/2002 | Maiteh et al. |
| 2005/0113963 | A1 | 5/2005 | Cho et al. |
| 2009/0148251 | A1 | 6/2009 | Glasser et al. |
| 2010/0298967 | A1* | 11/2010 | Frisken et al. ............... 700/173 |
| 2012/0089247 | A1 | 4/2012 | Kawauchi et al. |
| 2012/0221300 | A1 | 8/2012 | Tukora |
| 2013/0116984 | A1 | 5/2013 | Montana et al. |
| 2013/0116990 | A1 | 5/2013 | Montana et al. |

OTHER PUBLICATIONS

"ATI Stream Computing OpenCL™ Programming Guide," ATI Stream Computing Programming Guide, Advanced Micro Devices, Inc., *p. 4-37*, Jun. 1, 2010.
Hook, T.V., "Real-Time Shaded NC Milling Display," *Computer Graphics, ACM*, 20(4): 15-18 (Aug. 18, 1986).
Huang, Yunching et al., "NC Milling Error Assessment and Tool Path Correction," *Proceedings of the 21st Annual Conference on Computer Graphics and Interactive Techniques*, 1994.
Ilushin, O. et al., "Precise Global Collision Detection IN Multi-Axis NC-Machining," *Computer-Aided Design*, 37: 909-920 (2005).
Jimenez, P. et al., "3D Collision Detection: A Survey," *Computer & Graphics*, 25(2): 269-285 (Apr. 1, 2001).
König, A. H. et al., "Real Time Simulation and Visualization of NC Milling Processes for Inhomogeneous Materials on Low-End Graphics Hardware," IEEE Proceedings, Hannover, Germany, pp. 338-349 (Jun. 22-26, 1998).
Liu, S.Q. et al., "Real-Time, Dynamic Level-of-Detail Management for Three-Axis NC Milling Simulation," *Computer-Aided Design*, 38(4): 378-391 (Apr. 2006).
Mayr, H. el al., "A Solid Modeler for Dynamic Objects Using the Dexel Representation," *Proceeding of ICED '91, International Conference on Engineering Design*, Zurich, Switzerland, pp. 1082-1085 (Aug. 27, 1991).
Muller, H. et al., "Online Sculpting and Visualization of Multi-Dexel Volumes," *SM '03 Proceedings of the 8th ACM Symposium on Solid Modeling and Applications*.
Peng, X. et al., "A Virtual Sculpting System Based on Triple Dexel Models with Haptics," *Computer-Aided Design and Applications*, 6(5): 645-659 (Jan. 1, 2009).
Ren, Y. et al., "Virtual Prototyping and Manufacturing Planning by Using Tri-Dexel Models and Haptic Force Feedback," *Virtual and Physical Prototyping*, 1(1): 3-18 (Mar. 2006).
Stifter, S., "Simulation of NC Machining Based on the Dexel Model: A Critical Analysis," *Int. J. Adv. Manuf. Technol.*, 10: 149-157 (1995).
Tang, T.D. et al., "The Sweep Plane Algorithm for Global Collision Detection with Workpiece Geometry Update for Five-Axis NC Machining," *Computer Aided Design*, 39: 1012-1024 (2007).
Tukora, B. et al., "Fully GPU-based Volume Representation and Material Removal Simulation of Free-Form Objects," *Innovative Developments in Design and Manufacturing Advanced Research in Virtual and Rapid Prototyping—Proceedings of VR*, pp. 609-614 (Jan. 1, 2009).
Tukora, B. et al., "GPGPU-Based Material Removal Simulation and Cutting Force Estimation," *Proceedings of the Seventh International Conference on Engineering Computational Technology*, (1994).
Tukora, B. et aL, "Multi-Dexel based Material Removal Simulation and Cutting Force Prediction with the Use of General-Purpose Graphics Processing Units," *Advances in Engineering Software*, 43(1): 65-70 (Aug. 16, 2011).
Wang, C.L. et al., "Layered Depth-Normal Images: A Sparse Implicit Representation of Solid Models," *Proceedings of ASME International Design Engineering Technical Conferences*, Brooklyn, NY.
European Search Report for European Application No. EP 11 30 6422; Date of Completion of Search: May 11, 2012.
European Search Report for European Application No. EP 11 30 6423; Date of Completion of Search: Jun. 19, 2012.
European Search Report for European Application No. EP 11 30 6424; Date of Completion of Search: May 24, 2012.
Albert, M., An Overview of 3 + 2 Machining, Oct. 4, 2006, http://www.mmsonline.com/articles/an-overview-of-3-2-machining.
Hopkins, B., Benefits of Positional Five-Axis Machining, May 1, 2007, http://www.moldmakingtechnology.com/articles/benefits-ofpositional-five-axis-machining.
MoldMaking, Five-Axis CAD/CAM Integration Helps Optimize Moldmaker's Machine Utilization, Apr. 1, 2011, http://www.moldmakingtechnology.com/articles/five-axis-cadcam-integration-helps-optimize-moldmakers-machine-utilization.
Kadir, A.A., et al., "Virtual Machine Tools and Virtual Machining—A Technical Review," *Robotics and Computer-Integrated Manufacturing*, 27: 494-508 (2010).
Peng, X., Interactive Solild Modelling in a Virtual Environment with Haptic Interface, Virtual and Augmented Reality Applications in Manufacturing, Springer-Verlag London 2004.
Wang, W.P., Geometric Modeling for Swept Volume of Moving Solids, IEEE, 1986 Van Hook, T., Real-Time Shaded NC Milling Display, SIGGRAPH 1986, vol. 20, No. 4, 1986.
Van Hook., T., "Real-Time Shaded NC Milling Display," SIGGRAPH, 20(4)15-18 (1986).
Zalewski, M., Guerrilla Guide to CNC Machining, vol. 1: Basic Theory and Preparations, http://diyhpl.us/~bryan/papers2/guerilla_enc1.html.
Wright (Tool Path Generation for Finish Machining of Freeform Surfaces in the Cybercut Process Planning Pipeline, LMAS UC Berkeley, 2007).

\* cited by examiner

DESIGNING A MODELED VOLUME REPRESENTED BY DEXELS

RELATED APPLICATION

This application claims priority under 35 U.S.C. §119 or 365 to European Patent Application No. 11306422.4, filed Nov. 3, 2011.

The entire teachings of the above application(s) are incorporated herein by reference.

FIELD OF THE INVENTION

The invention relates to the field of computer programs and systems, and more specifically to a method, system and program for designing a modeled volume represented by a set of dexels.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Some of these systems allow the representation of a modeled volume with a set of dexels. Several papers or patent documents notably suggest using dexel representation for machining simulation or interactive sculpting.

Examples of such documents are:
the paper entitled "A Virtual Sculpting System Based on Triple Dexel Models with Haptics", Xiaobo Peng and Weihan Zhang, Computer-Aided Design and Applications, 2009;
the paper entitled "NC Milling Error Assessment and Tool Path Correction", Yunching Huang and James H. Oliver, Proceedings of the 21st annual conference on Computer graphics and interactive techniques, 1994;
"Online Sculpting and Visualization of Multi-Dexel Volumes", Heinrich Muller, Tobias Surmann, Marc Stautner, Frank Albersmann, Klaus Weinert, SM '03 Proceedings of the eighth ACM symposium on Solid modeling and applications;
the paper entitled "Virtual prototyping and manufacturing planning by using tridexel models and haptic force feedback", Yongfu Ren, Susana K. Lai-Yuen and Yuan-Shin Lee, Virtual and Physical Prototyping, 2006;
the paper entitled "Simulation of NC machining based on the dexel model: A critical analysis", Sabine Stifter, The International Journal of Advanced Manufacturing Technology, 1995;
the paper entitled "Real time simulation and visualization of NC milling processes for inhomogeneous materials on low-end graphics hardware", Konig, A. H. and Groller, E., Computer Graphics International, 1998. Proceedings;
U.S. Pat. No. 5,710,709;
U.S. Pat. No. 7,747,418.

GPGPU (General-Purpose computing on Graphics Processing Units) is the technique of using a graphic processing unit (GPU) which typically handles computation only for computer graphics, to perform computation in applications traditionally handled by the central processing unit (CPU). Some papers consider using the computation power of modern graphics processing units (GPU) for dexel representation. These papers make use of the LDNI (Layered Depth-Normal Images) algorithm, which is associated to a specific memory model.

Examples of such papers are:
the paper entitled "GPGPU-based Material Removal Simulation and Cutting Force Estimation", B. Tukora and T. Szalay, CCP: 94: Proceedings Of The Seventh International Conference On Engineering Computational Technology;
the paper entitled "Layered Depth-Normal Images: a Sparse Implicit Representation of Solid Models", Charlie C. L. Wang and Yong Chen, Proceedings of ASME international design engineering technical conferences. Brooklyn (N.Y.).

Some authors suggest improving depth buffers models, which are the simplest incarnation of dexel models, by managing level of details with hierarchical grid refinements. This is notably suggested in the paper entitled "Real-time, dynamic level-of-detail management for three-axis NC milling simulation", by S. Q. Liu, S. K. Ong, Y. P. Chen, A. Y. C. Nee.

However, the solutions listed above lack efficiency, notably from a user utilization point of view. Within this context, there is still a need for an improved solution for designing a modeled volume represented by a set of dexels.

SUMMARY OF THE INVENTION

According to one aspect, it is therefore provided a computer-implemented method for designing a modeled volume. The method comprises providing a sculpting process on the modeled volume, initial lines, and an initial set of dexels that represents the modeled volume after going through the sculpting process and that is based on the initial lines. Each dexel of the initial set comprises a set of at least one segment representing the intersection between each initial line and the modeled volume. The method then comprises providing new lines by refining the initial lines. The method also comprises determining a new set of dexels that represents the modeled volume after going through the sculpting process and that is based on the new lines. Determining the new set of dexels comprises determining sets of at least one segment representing the intersection between each new line and the modeled volume before going through the sculpting process and then applying the sculpting process on the determined sets of at least one segment.

The method may comprise one or more of the following:
- refining the initial lines comprises any or a combination of increasing the density of the initial lines; changing the direction of the initial lines; and/or discarding part of the initial lines;
- refining the initial lines comprises providing a box bounding at least part of the modeled volume before going through the sculpting process, a view of the box, and tracing lines intersecting the box in the direction of the view and with a predetermined density;
- dexels of the initial set of dexels are associated with sculpting operations that impacted them, the sculpting process being provided as the series of the sculpting operations;
- the sculpting operations are linked to the segments of the dexels that they last impacted;
- each of the sculpting operations is linked to a respective segment of the dexels and is a resultant of previously performed sculpting operations having an impact on the respective segment;
- the method comprises displaying the modeled volume on a screen, and wherein refining the initial lines comprises increasing the density of the initial lines, up to one line per pixel of the screen, whereby one line is associated to each pixel of the screen.

It is further proposed a CAM system comprising a memory having recorded thereon instructions for performing the above method, a processor coupled with the memory, and at least one graphical user interface coupled with the processor and suitable for execution of the instructions. The processor may be a GPU (Graphics Processing Unit).

It is further proposed a computer program comprising instructions for performing the above method.

It is further proposed a computer readable storage medium having recorded thereon the above computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
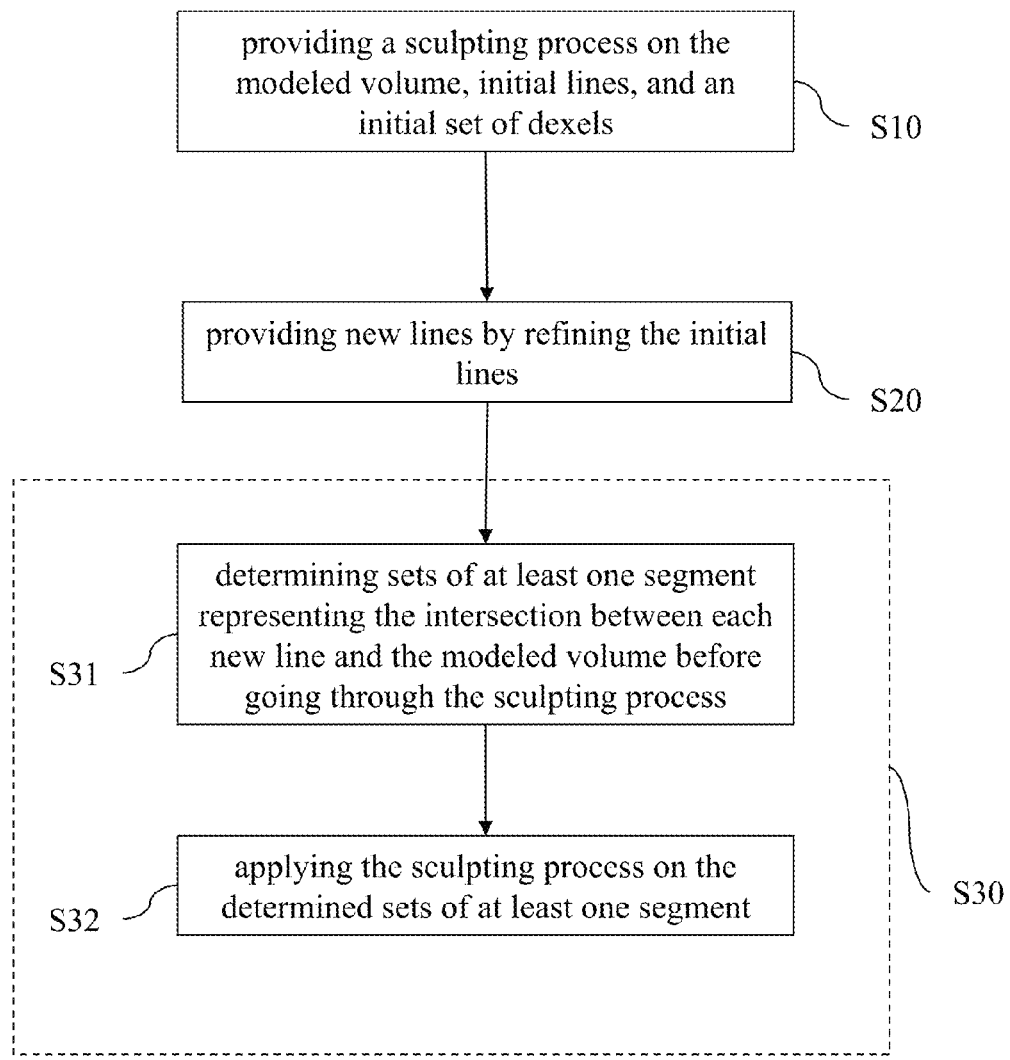
FIG. 1 shows a flowchart of an example of the method.

FIG. 1 shows a flowchart of an example of a computer-implemented method for designing a modeled volume. The method comprises providing (S10) a sculpting process on the modeled volume, initial lines, and an initial set of dexels. The initial set of dexels represents the modeled volume after going through the sculpting process and is based on the initial lines. Each dexel of the initial set comprises a set of at least one segment representing the intersection between each initial line and the modeled volume. The method then comprises providing (S20) new lines by refining the initial lines. The method further comprises determining (S30) a new set of dexels that represents the modeled volume after going through the sculpting process and that is based on the new lines. Determining (S30) the new set of dexels comprises determining (S31) sets of at least one segment representing the intersection between each new line and the modeled volume before going through the sculpting process and, then, applying (S32) the sculpting process on the determined sets of at least one segment. This method refines the dexel representation of the modeled volume.

The method may be comprised in a process of designing a CAD modeled object. "Designing a CAD modeled object" designates any action or series of actions which is at least part of a process of elaborating a modeled object. Thus, the method may comprise creating the CAD modeled object from scratch. Alternatively, the method may comprise providing a CAD modeled object previously created, and then modifying the CAD modeled object. In any case, the modeled volume designed by the method may represent the CAD modeled object or at least part of it, e.g. a 3D space occupied by the CAD modeled object. Because the method improves the design of a modeled volume represented by a set of dexels, the method also improves the design of a CAD modeled object.

A modeled object is any object defined by data stored in a memory of a computer system. By extension, the expression "modeled object" designates the data itself. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space).

The method may be included in a manufacturing process, which may comprise, after performing the method, producing a physical product corresponding to the modeled volume. In any case, the modeled volume designed by the method may represent a manufacturing object. The modeled volume may thus be a modeled solid (i.e. a modeled object that represents a solid). The manufacturing object may be a product, such as a part, or an assembly of parts. Because the method improves the design of the modeled volume, the method also improves the manufacturing of a product and thus increases productivity of the manufacturing process. The method can be implemented using a CAM system, such as DELMIA. A CAM system is any system suitable at least for defining, simulating and controlling manufacturing processes and operations.

The method is computer-implemented. This means that the method is executed on at least one computer, or any system alike. Unless mentioned otherwise, all steps of the method are performed by the computer, i.e. without intervention of the user. For example, the step of determining (S30) may be performed by the sole computer, whereas the step of providing (S10) and the step of providing (S20) may be performed through user-interaction. Indeed, the step of providing (S10) may be previously performed by the user. The method thereby allows the automatic modification of the set of dexels that represents the modeled volume, in function of the new lines provided (S20) possibly by the user.

A typical example of computer-implementation of the method is to perform the method with a system suitable for this purpose. The system may comprise a memory having recorded thereon instructions for performing the method. In other words, software is already ready on the memory for immediate use. The system is thus suitable for performing the method without installing any other software. Such a system may also comprise at least one processor coupled with the memory for executing the instructions. In other words, the system comprises instructions coded on a memory coupled to the processor, the instructions providing means for performing the method. Such a system is an efficient tool for designing a modeled volume.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system may comprise at least one GUI for launching execution of the instructions, for example by the user. Notably, the GUI may allow the user to perform the step of providing (S10). This may be done prior to the providing (S20). Or, the sculpting process, the initial lines and the initial set of dexels may be retrieved at the time the user provides (S20) new lines by refining the initial lines. The GUI may also allow the user to provide the sculpting operation (S20). The GUI may comprise a GPU. In such a case, the processor may be the GPU. In other words, the processor executing at least steps of the method, in particular the step of determining (S30), may be the GPU. Such a system is an efficient tool for designing a modeled volume by a user. Since dexel based algorithms are well suited for massively parallel hardware, it is natural to consider using the computation power of modern graphic processing unit (GPU).

The modeled volume may be 3D (i.e. three-dimensional). This means that the modeled volume is defined by data allowing its 3D representation. A 3D representation allows the viewing of the represented volume from all angles. For example, the modeled volume, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

Figure 2:
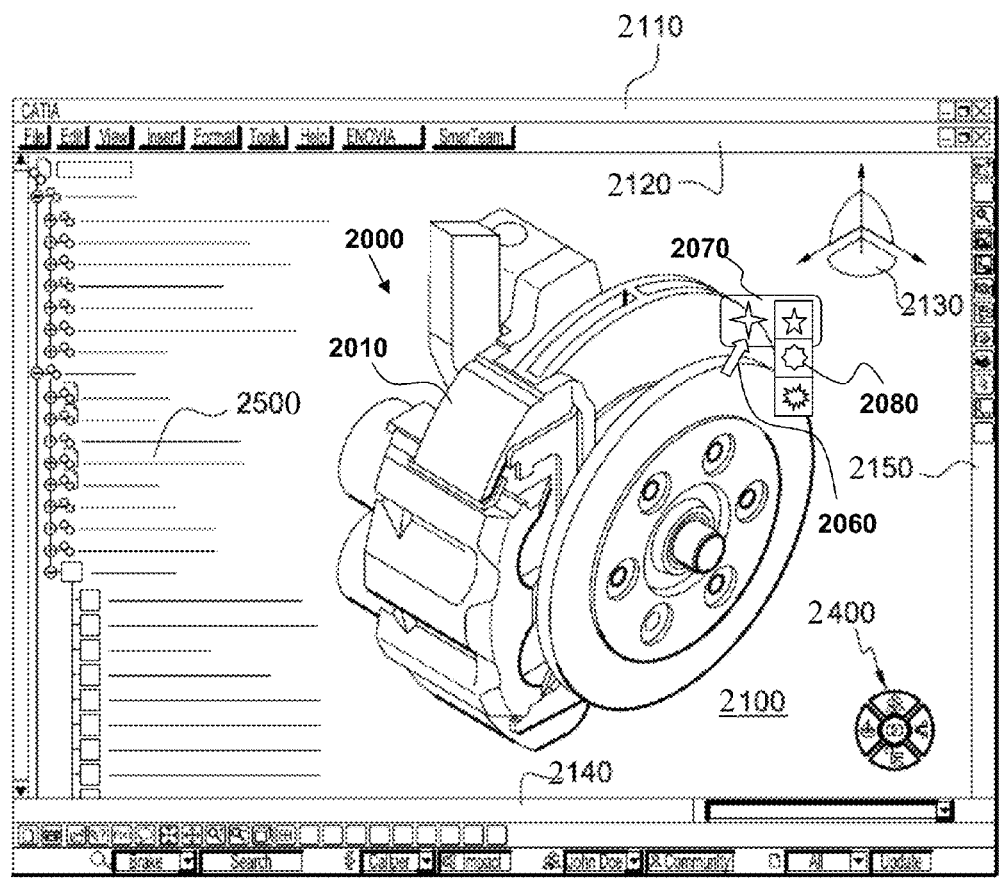
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. a sculpting operation, or any other operation such change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
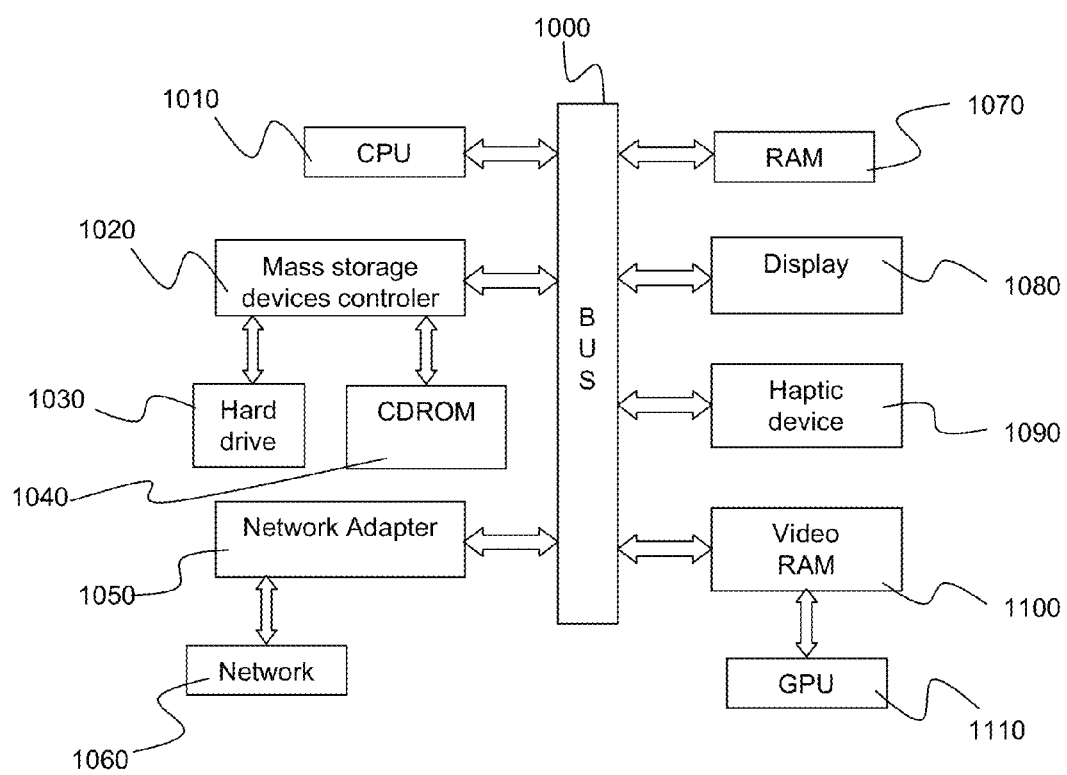
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The method makes use of sets of dexels that represent the modeled volume. This allows a light representation of the modeled volume (in other words, the modeled volume may be represented using little memory space). This also allows a representation of the modeled volume which may be easily handled. Notably, design operations on the modeled volume may be performed particularly efficiently when the modeled volume is represented by a set of dexels, due to the data structure of a set of dexels. Indeed, design operations may be performed with high responsiveness and high robustness. Notably, operations on a set of dexels may be performed through parallel processing, on a line-by-line basis, so as to gain in efficiency.

The initial set of dexels provided at step (S10) is a first set of dexels, which is based on initial lines (i.e. first lines), whereas the new set of dexels is a second set of dexels, which is based on new lines, which are second lines provided at step (S20).

The term "dexel" is known to be a shortcut for "depth element" (just as the term "pixel" is a shortcut for "picture element"). The notion of dexel has been mentioned in a large number of research papers. In the context of the method, a dexel comprises a set of at least one segment, i.e. a pair of 3D points. In an example, the modeled volume comprises at least one dexel which comprises a set of at least two segments (e.g. the initial set of dexels and/or the new set of dexels comprise(s) at least two segments). The segments of a dexel, if several, may be ordered (in such a case the dexel is a list), or unordered. The segments of a dexel represent the intersection between a line and the modeled volume. In other words, considering virtual lines intersecting with the modeled volume, a dexel is the set of the segments originating from a given line and that results from the computation of the intersection. For this reason, a dexel is said to be based on lines (i.e. its segments lie on the line). For example, the initial set of dexels is based on the initial lines whereas the new set of dexels is based on the new lines. Providing (S10) the initial set of dexels and/or determining (S30) the new set of dexels may thus comprise computing such intersections, e.g. by tracing virtual lines and computing their intersections with the modeled volume, which may be initially represented by a B-Rep or any other volume representation. The sets of dexels thus represent the modeled volume.

It is important to note that the sets of dexels are provided as computer-implemented data. Thus, the definitions provided above and below regarding any representation of the modeled volume have implications from a data structure point of view. For example, a segment may be provided as a pair of 3D positions (e.g. two 3D positions linked to each other). A 3D position may itself be provided as a list of three coordinates (e.g. floating points), associated to a referential 3D frame. A dexel is a set of segments, which implies that segments are linked together in a set structure. The dexels of a set of dexels may as well be linked together. Representing the modeled volume by a set of dexels, which themselves comprise a set of at least one segment, allows a fast determining (S30).

Figure 4:
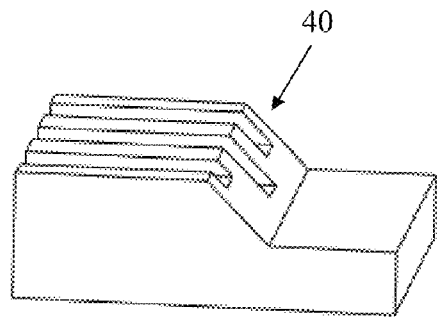
FIGS. 4-10 show examples of the method.
Figure 5:
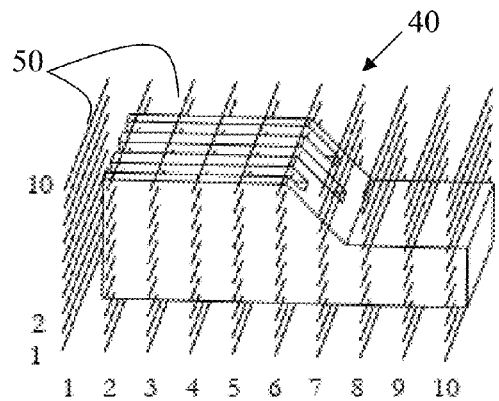

The concept of dexels is now illustrated with reference to FIGS. 4-6 which present an example of the step of providing (S10) the initial set of dexels as a dexel structure 67. Determining (S30) a new set of dexels could as well be performed based on the example of FIGS. 4-6.

Given a modeled volume and given an infinite line, a dexel is the set of segments (or intervals) representing the intersection between the infinite line and the modeled volume. This set of segments is captured, in the memory, as a set of boundary points of each segment. A dexel structure is a set of dexels (each comprising a set of segments) which are organized, for example by being ordered on a rectangular grid. FIGS. 4 and 5 illustrate a modeled volume 40 together with a ten by ten grid of lines 50. The method of the example comprises providing modeled volume 40, e.g. as a B-Rep, as illustrated on FIG. 4. The method of the example then comprises defining a ten by ten grid of lines 50 that intersect (at least partly) modeled volume 40, as illustrated on FIG. 5. The method of the example then comprises computing dexels 65 which comprise sets of segments 60 and/or 62, as represented on FIG. 6. One dexel 65 is circled on the figure. A dexel 65 may comprise several segments 60, or one segment 62, depending on whether the line 50 intersects modeled volume 40 at one spot or at several separate spots. Of course, the method may alternatively retrieve dexels 65 from a memory. In any case, dexel structure 67 is thus provided.

Figure 6:
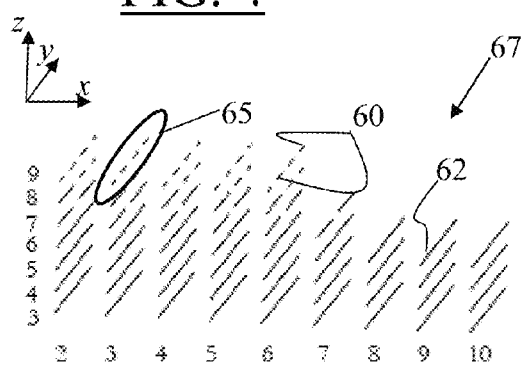

FIG. 6 illustrates the resulting dexel structure 67. It should be noticed that not all the lines 50 intersect modeled volume 40 (only fifty-two lines intersect modeled volume 40 in the example), yielding as many dexels 65 (lines not intersecting modeled volume 40 may indeed be discarded and yield no dexel). Furthermore, some lines 50 intersect modeled volume 40 through one segment 62 (dexel (2,3) or dexel (9,6) for example), others through several segments 60, for example two segments (dexel (7,7) or dexel (4,7) for example), or three segments (dexel (2,8) or dexel (5,8)), or four segments (dexel (2,9) or dexel (4,9)). The resulting dexel structure 67 includes fifty-two dexels 65 including thirty-six dexels 65 with one segment 62, six dexels 65 with two segments 60, five dexels 65 with three segments 60 and five dexels with fours segments 60.

The set of dexels provided at (S10) (or determined at (S30)) may be a tridexel structure. A tridexel structure is defined by comprising three dexel structures, typically a dexel structure parallel to the x-axis, a dexel structure parallel to the y-axis and a dexel structure parallel to z-axis. The method may comprise displaying a graphical representation of the modeled volume at any time, for example during the providing (S20) and the determining (S30). The displaying may be based on the set of dexels (the initial set of dexels or the new set of dexels, depending on when the displaying occurs). A tridexel structure provides a good display because it is little "view direction" dependant. A tridexel structure notably provides a more accurate display when the user changes the viewpoint.

Figure 7:
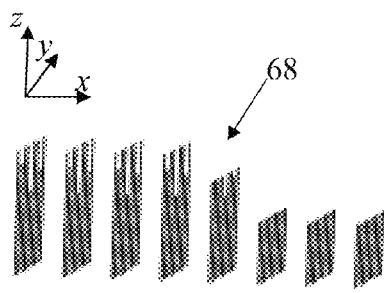
Figure 8:
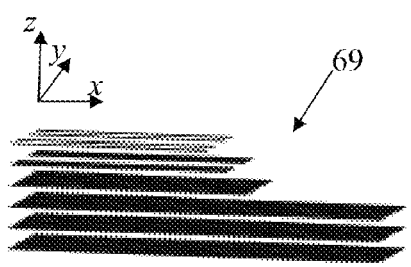

FIGS. 6-8 each represent a dexel structure representing a same modeled volume. In other words, the modeled volume may be defined by tridexel data, comprising the three dexel structures of FIGS. 6-8. FIG. 6 shows dexel structure 67, along the y-axis. FIG. 7 shows dexel structure 68, along the x-axis. FIG. 8 shows dexel structure 69, along the z-axis. On each figure, the lines of the dexels are parallel to the respective axis.

The outer normal vector to the boundary of the modeled volume at the end points of the segments may also be provided among the data. This allows a finer rendering of the modeled volume.

The method also comprises providing a sculpting process on the modeled volume. A sculpting process is any series of at least one sculpting operation. A sculpting operation is any operation provided by the system for sculpting the modeled volume. By sculpting the modeled volume, it is meant adding and/or removing volume from the modeled volume via Boolean operations. Thus, a sculpting operation is any combination of at least one volume Boolean operation on the modeled volume. For example, local volume removal and local volume addition are sculpting operations, whereas extrusion from a surface is not a sculpting operation because it is not based on any Boolean operation. In an example, the sculpting operation is a series of successive Boolean operations involving a continuous volume (i.e. not disjoint) which is added (or subtracted) to the modeled volume over a time duration. For example, the sculpting operation represents a machining operation.

Accordingly, the set of dexels may represent any solid and the sculpting process may simulate real sculpting of the solid. The method may notably be included in a real time machining simulation using a computer aided design system. In other words, the solid may be a stock and the method may display the shape of a stock being virtually machined by a cutting tool. In such a case, the modeled volume represents the stock, and the process is a cutting process. This example can be generalized to other manufacturing processes where material is also added to the part, such as composite manufacturing and shape sculpting on virtual clay. It can be generalized as well to all traditional solid modeling applications, including mechanical design, shape design, building architecture, etc. Finally, thanks to its performance capability, the method can handle more advanced applications such as interactive 3D sculpting. Most generally, a sculpting operation may represent a machining operation. In such a case, the modeled volume may represent a workpiece undergoing the machining operation, and the method thus improves the simulation of the machining of a workpiece. The method may thus serve as a good basis for testing virtually machining processes.

Indeed, the method further comprises providing (S20) new lines by refining (i.e. modifying upon user request) the initial lines and determining (S30) a new set of dexels that represents the modeled volume after going through the sculpting process and that is based on the new lines. In other words, the method applies the sculpting process to the new lines, or, yet in other words, the method determines the result of sculpting the modeled volume define by a set of dexels based on the new lines, according to the sculpting process. The new set of dexels represents the object after the sculpting (e.g. the machining), based on a refined set of lines. Therefore, the method allows a modification of the representation of a modeled volume having gone through a sculpting process, towards a refined representation.

Each dexel comprises a set of segments. All segments of a line intersecting the modeled volume are grouped into one dexel. This allows a line-by-line, and thus a more efficient processing of the modeled volume, for example because it allows parallel processing. Indeed, the method may be executed by parallel processing, on a line-by-line basis.

Parallel processing consists of performing multiple tasks by the system simultaneously. In the case of the method, determining (S30) the new set of dexels may comprise running a single instructions thread on each of the new lines. Determining (S30) the new set of dexels may thus be performed by SIMD (Single Instruction Multiple Data) parallel processing. The processor of the system executing the method may notably be a massive parallel processing unit, for example if the system is networked with more than 10, or 100, processors.

In an example, the method comprises (or is performed after) a machining simulation phase performed by a user. At all times, the set of dexels as it stands is a representation of a modeled volume that represents any solid, e.g. a workpiece. In the machining simulation phase, the user applies a sculpting process on an "origin" set of dexels. The "origin" set of dexels may be retrieved from a memory or by intersecting a set of "origin" lines with a reference volume, e.g. a stock, stored e.g. as a B-Rep, as discussed above with reference to FIGS. 4-8. Applying the sculpting process on the "origin" set of dexels may be performed according to any known procedure. For example, if the sculpting process comprises a cutting operation, an impacted dexel may be subtracted one or more of its segments, or one or more of its segments may be shortened. Conversely, if the sculpting process comprises a material addition operation, an impacted dexel may see one or more of its segments lengthened or be incremented of one or more new segment. Eventually, applying the sculpting process on the "origin" set of dexels modifies the set of dexels so as to reach the initial set of dexels. Data on the sculpting process and on the reference modeled volume (e.g. the B-Rep, or, the origin set of dexels) is also saved.

At this point, a user (possibly the same user or another user) may perform the method. For example, the user may retrieve the initial set of dexels. From such data, the initial lines may be determined. Alternatively, the initial lines may have been stored and the method may comprise directly retrieving them. Also, the method comprises providing the sculpting process of the machining phase. In other words, data indicating the sculpting process which the modeled volume has undergone (so as to reach the initial set of dexels from the reference volume) is provided. This allows the retrieval of a sculpting history of the modeled object at any time. The initial set of dexels may be displayed to the user.

Then, the method provides (S20) new lines by refining the initial lines. Refining the initial line may be any request performed by the user to modify the representation of the modeled volume (such representation being the initial set of dexels at this point). Refining the initial lines may comprise any or a combination of increasing the density (i.e. the number per volumetric unit) of the initial lines; changing the direction of (at least part of) the initial lines; and/or discarding (i.e. deleting) part of the initial lines. In other words, the user asks for a new representation of the modeled volume, and the method handles such request by providing new lines to intersect the modeled volume. New dexels are determined at step (S30) and the new representation may be displayed to the user. This allows an efficient modification of the representation of the modeled volume upon user request. This may thus allow an on-demand modification of the representation of the modeled volume as displayed to the user. The work of the user may thus be facilitated e.g. for further machining simulation phases.

For example, the user may request a zoom. In such a case, the method may select a zone of the modeled volume corresponding to the requested zooming zone and discard initial lines which do not cross that zone. The method may further increase the density of the lines crossing the zone, which leads to new lines. The method may also comprise modifying the viewpoint (of the display), and accordingly comprise modifying the direction of the initial lines so as to be directed according to the new viewpoint. This allows a finer representation, notably on the boundaries of the projection of the modeled volume on the screen.

Also, the user may request a High Definition visualization of the sculpting process at any time. In such a case, the method may comprise increasing the number of lines, e.g. up to 1 line per pixel. For example, one line may be associated to each pixel of the screen. In other words, one line passes through each pixel of the screen and may intersect the modeled volume. This allows a finest displaying while using an optimal number of lines.

The method determine (S30) a new set of dexels that represents the modeled volume after going through the sculpting process and that is based on the new lines. This may be done by determining the intersection of the new lines with the reference volume (i.e. the unprocessed modeled volume), i.e. determining (S31) sets of at least one segment representing the intersection between each new line and the modeled volume before going through the sculpting process, and then applying (S32) the sculpting process on the determined sets of at least one segment (according to any know method, just as discussed above).

By keeping key data such as data on the sculpting process and data on the modeled volume before it has gone through the sculpting process, the method may refine the set of dexels representing the modeled volume, and e.g. thereby refine the displaying of the modeled volume based on a set of dexels, at any time and in an efficient manner. Indeed, the method may exclusively provide new lines, and then perform operations on these new lines to reduce them to sets of segments defining dexels. This presents a high efficiency from a processor point of view. Also, this refinement is highly robust and responsive to user request (the execution of the method being secure and fast). This is particularly advantageous when the modeled volume is displayed to the user, and the user provides new lines so as to modify the displaying in real-time.

Refining the initial lines may be performed upon user action, e.g. as a consequence of the user interacting with the graphical display of the initial set of dexels. For example, refining the initial lines may comprise providing a box bounding at least part of the modeled volume before going through the sculpting process, a view of the box, and tracing lines intersecting the box in the direction of the view and with a predetermined density. The box may typically be a parallelepiped, a sphere, or any volume, that bounds at least part of the modeled volume. For example, a user may select with a haptic device of the system a point of view, e.g. by defining a position and/or an orientation of one or several cameras, the method thereby automatically providing a corresponding box. Now, possibly upon (e.g. the same) user action or not, a view of the box may be defined. By "view", it is meant a perspective according to which the modeled volume is displayed. Therefore, tracing (i.e. drawing) lines intersecting the box may be performed in the direction of the view (i.e. each new line traced may correspond to a direction following which the object is viewed). In other words, the lines are traced along the directions, along which points of the modeled volume are projected on the screen. It is noted that the lines may be parallel or not parallel. The direction of the view may indeed be single, but also multiple, for example in the case of a conical perspective. In any case, the lines are always traced according to a direction imposed by the view (the direction being possibly different for each line).

Dexels of the initial set of dexels may be associated with sculpting operations that impacted them. In such a case, the sculpting process is provided as the series of said sculpting operations (e.g. information regarding the sequence according to which the sculpting operations are performed being possibly stored as well). In other words, the data provided for the initial set of dexels may comprise information regarding sculpting operations that impacted each of the dexels, i.e. that modified the dexel geometry. This allows an efficient applying (S32). Indeed, following the providing (S20), some of the initial lines may be kept. By associating sculpting operations to dexels, or, equivalently, to lines corresponding to such dexels, the method may apply (S40) the sculpting process as the series of sculpting operations associated to the initial lines that are kept, instead of the series of all the sculpting operations.

The sculpting operations may be linked to the segments of the dexels that they last impacted. In other words, the data provided at step (S10) comprises links between the sculpting operations and segments of the dexels, thereby associating sculpting operations to dexels via their segments. Those segments are the ones last impacted by said sculpting operations.

Alternatively, each of the sculpting operations is linked to a respective segment of the dexels and is a resultant of previously performed sculpting operations having an impact on the respective segment. In other words, several sculpting operations are combined so as to provide a "resultant" operation. This way, memory is saved, and previously performed sculpting operations are stored as a single sculpting operation leading to the same impact on the dexels in an optimized way. The step of applying (S32) may thus be performed faster.

Each end of a dexel segment may be equipped with an elementary operation reference field (for example an integer number). For example, in the case of machining simulation, the elementary operation reference is a reference toward a couple (tool, e.g. cutting tool or material adding tool, and element of trajectory). During the simulation, when the end of a dexel segment is updated, the reference field is updated as the corresponding elementary operation reference in the sculpting process that induced the update. In other words, each segment extremity points to its trimming operation.

The applying (S32) is thus accelerated by computing an initialization from the initial grid and then playing only the subset of the sculpting operations, typically Boolean operations that are actually contributing to the boundary of the current state of the represented solid. This is particularly advantageous when the current solid state results in a large number of sculpting operations, which is an option of the method. For example, machining simulation may typically handle solid states resulting from millions of local Boolean operations with swept solids.

Since the efficient refinement procedure can be performed on an arbitrarily small and therefore fine grid, it provides an arbitrary accuracy on demand, within an affordable response time. In practice, this enables local accurate zooms or refined computations at a reasonable computing time.

An example of the method is now discussed.

Given a sculpting process, given a reference grid on which the sculpting process was previously executed up to a certain point and given a box, the refinement procedure is to execute again the sculpting process on a finer grid fitting in the given box. The box captures the new zoom and view point defined by the user. In order to make this execution efficient the procedure performs the following steps.

1. The set of segment end points belonging to the box is collected, from which two kinds of information are gathered. First a geometric approximation of the result, second the set of elementary operation references associated to the collected ends of dexels.

2. The finer grid is initialized from the approximate collected geometry. An upper (containing) approximation in the case of negative Boolean operations (set differences), such as machining operation, or a lower approximation (contained approximation) in the case of positive Boolean operations (union, Minkowski sums, etc.).

3. The subset of the sculpting process corresponding to the collected elementary operation references is executed on the fine grid. In the case of machining simulation this may include initializing the initial solid if some collected end of dexel segment mentions it, and replay all collected trajectory elements.

Figure 9:
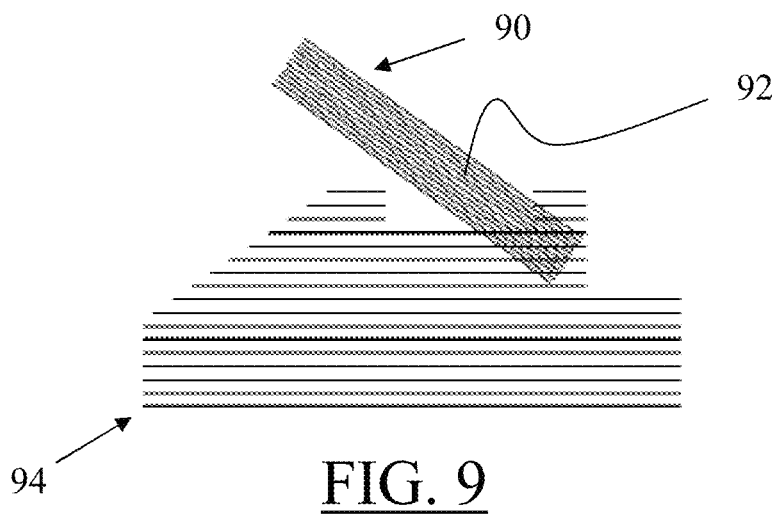
Figure 10:
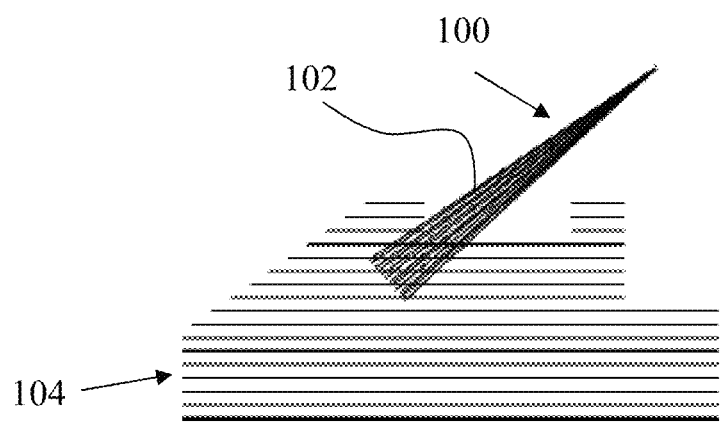

Since the finer grid may usually perform on a small subset of the reference grid, the set of elementary operations that need to be executed is likely to be much smaller than the whole scenario. Referring to FIGS. 9-10, the box corresponding to the finer grid can be a parallelepiped 90 that is not parallel to the axis system or a frustum 100 if the goal of the refinement is a local visualization (zoom). In this later case, the new lines 102 in the grid are not parallel to a given direction, but suited for conical perspective. As can be seen, the new lines 92 or 102 may be of a different direction than the initial dexels 94 and 104.

The invention claimed is:

1. A computer-implemented method for designing a modeled volume, wherein the method comprises:

with respect to a subject modeled volume, providing: (i) a sculpting process as a series of sculpting operations, (ii) initial lines, and (iii) an initial set of dexels, wherein the initial set represents the modeled volume after undergoing the sculpting process and is based on the initial lines, each dexel of the initial set comprising a set of segments representing an intersection between a respective one of the initial lines and the modeled volume, wherein the intersections of different initial lines are represented by respective different sets of segments, and wherein dexels of the initial set of dexels are associated with sculpting operations of the series that impact the dexels;

providing new lines by refining the initial lines, wherein refining the initial lines comprises at least one of (i) increasing the density of the initial lines and (ii) discarding part of the initial lines; and determining a new set of dexels that represents the modeled volume after undergoing the sculpting process and is based on the new lines, wherein determining the new set of dexels comprises: (i) determining sets of segments, each set of the determined sets of segments representing an intersection between a different new line of the new lines and the modeled volume before undergoing the sculpting process, wherein the sets of segments are determined by retrieving history of the modeled volume and (ii) applying the sculpting process on the determined sets of segments using the series of sculpting operations associated with dexels of the initial set, wherein the associated dexels correspond to lines of the initial lines that are kept as part of the new lines.

2. The method of claim 1, wherein refining the initial lines comprises providing a box bounding at least part of the modeled volume before undergoing the sculpting process, a view of the box, and tracing lines intersecting the box in the direction of the view and with a predetermined density.

3. The method of claim 1, wherein the sculpting operations are linked to segments of the dexels last impacted by the sculpting operations.

4. The method of claim 1, wherein each of the sculpting operations is linked to a respective segment of the dexels and is a resultant of previously performed sculpting operations having an impact on the respective segment.

5. The method of claim 1, wherein the method comprises displaying the modeled volume on a screen, and wherein refining the initial lines comprises increasing the density of the initial lines, up to one line per pixel of the screen, whereby one line is associated to each pixel of the screen.

6. A CAM system for designing a modeled volume comprising:

a processor coupled with memory to design a modeled volume, the processor configured to:

provide: (i) a sculpting process having a series of sculpting operations, (ii) initial lines, and (iii) an initial set of dexels, wherein the initial set represents the modeled volume after undergoing the sculpting process and is based on the initial lines, each dexel of the initial set comprising a set of segments representing an intersection between a respective one of the initial lines and the modeled volume, wherein the intersections of different initial lines are represented by respective different sets of segments, and wherein dexels of the initial set of dexels are associated with sculpting operations of the series that impact the dexels;

provide new lines by refining the initial lines, wherein refining the initial lines comprises at least one of (i) increasing the density of the initial lines and (ii) discarding part of the initial lines; and determine a new set of dexels that represents the modeled volume after undergoing the sculpting process and is based on the new lines, wherein determining the new set of dexels comprises: (i) determining sets of segments, each set of the determined sets of segments representing an intersection between a different new line of the new lines and the modeled volume before undergoing the sculpting process, wherein the sets of segments are determined by retrieving history of the modeled volume from the memory and then (ii) applying the sculpting process on the determined sets of segments by applying the series of sculpting operations associated with dexels of the initial set, wherein the associated dexels correspond to lines of the initial lines that are kept as part of the new lines; and a graphical user interface coupled to the processor, the graphical user interface configured to request the processor to design the model volume.

7. The system of claim 6, wherein the processor is a GPU (Graphics Processing Unit).

8. A computer program product, comprising:

a non-transitory computer readable storage medium, the computer readable storage medium having instructions configured for designing a modeled volume by:

providing: (i) a sculpting process as a series of sculpting operations, (ii) initial lines, and (iii) an initial set of dexels, wherein the initial set represents the modeled volume after undergoing the sculpting process and is based on the initial lines, each dexel of the initial set comprising a set of segments representing an intersection between a respective one of the initial lines and the modeled volume, wherein the intersections of different initial lines are represented by respective different sets of segments, and wherein dexels of the initial set of dexels are associated with sculpting operations of the series that impact the dexels;

providing new lines by refining the initial lines, wherein refining the initial lines comprises at least one of (i) increasing the density of the initial lines and (ii) discarding part of the initial lines; and determining a new set of dexels that represents the modeled volume after undergoing the sculpting process and is based on the new lines, wherein determining the new set of dexels comprises: (i) determining sets of segments, each set of the determined sets of segments representing an intersection between a different new line of the new lines and the modeled volume before undergoing the sculpting process, wherein the sets of segments are determined by retrieving history of the modeled volume and (ii) applying the sculpting process on the determined sets of segments using the series of sculpting operations associated with dexels of the initial set, wherein the associated dexels correspond to lines of the initial lines that are kept as part of the new lines.

* * * * *